United States Patent
Kim et al.

(10) Patent No.: US 8,605,537 B2
(45) Date of Patent: Dec. 10, 2013

(54) COLUMN ADDRESS CIRCUIT OF SEMICONDUCTOR MEMORY DEVICE AND METHOD OF GENERATING COLUMN ADDRESSES

(75) Inventors: Min Su Kim, Gyeonggi-do (KR); Jin Su Park, Daegu (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 90 days.

(21) Appl. No.: 13/337,386

(22) Filed: Dec. 27, 2011

(65) Prior Publication Data
US 2012/0170394 A1 Jul. 5, 2012

(30) Foreign Application Priority Data

Dec. 30, 2010 (KR) .................. 10-2010-0139181

(51) Int. Cl.
*G11C 8/00* (2006.01)
*G11C 8/18* (2006.01)

(52) U.S. Cl.
USPC .............. 365/233.1; 365/233.12; 365/236

(58) Field of Classification Search
USPC ................... 365/233.1, 233.12, 236
See application file for complete search history.

(56) References Cited

U.S. PATENT DOCUMENTS

| | | | | |
|---|---|---|---|---|
| 6,088,255 A * | 7/2000 | Matsuzaki et al. | ....... | 365/233.12 |
| 6,201,423 B1 * | 3/2001 | Taguchi et al. | ............ | 365/233.1 |
| 6,298,004 B1 * | 10/2001 | Kawasaki et al. | ......... | 365/233.12 |
| 6,611,475 B2 * | 8/2003 | Lin | ............................ | 365/233.1 |
| 6,618,319 B2 * | 9/2003 | Ooishi et al. | .............. | 365/233.1 |

FOREIGN PATENT DOCUMENTS

KR 1020070002821 1/2007

OTHER PUBLICATIONS

Notice of Allowance issued by the Korean Intellectual Property Office on Dec. 26, 2012.

* cited by examiner

*Primary Examiner* — Trong Phan
(74) *Attorney, Agent, or Firm* — IP & T Group LLP

(57) ABSTRACT

The column address circuit of a semiconductor memory device according to an aspect of the present disclosure includes a column address generation circuit configured to generate an internal dummy clock in response to a data output enable signal, generate an internal clock in response to a read enable signal, generate first count addresses in response to the internal dummy clock, and generate normal count addresses in response to the internal clock after the generation of the first count addresses, where the read enable signal is activated later than the data output enable signal, and a column address output circuit configured to store the first count addresses and the normal addresses and to generate column addresses by synchronizing the first count addresses and the normal addresses with output clocks, respectively.

31 Claims, 5 Drawing Sheets

COLUMN ADDRESS CIRCUIT OF SEMICONDUCTOR MEMORY DEVICE AND METHOD OF GENERATING COLUMN ADDRESSES

CROSS-REFERENCE TO RELATED APPLICATION

Priority to Korean patent application number 10-2010-0139181 filed on Dec. 30, 2010, the entire disclosure of which is incorporated by reference herein, is claimed.

BACKGROUND

Exemplary embodiments relate to the column address circuit of a semiconductor memory device and a method of generating column addresses and, more particularly, to the column address circuit of a semiconductor memory device and a method of generating column addresses which are capable of securing adequate margin for the column address when data is outputted.

Among various types of semiconductor memory devices, there is an increasing demand for nonvolatile memory devices which can be electrically programmed and erased and which do not require the refresh function of rewriting data at specific intervals.

A column address circuit of a nonvolatile memory device may receive a start column address from outside and increase a column address whenever an internal clock CK4CNT generated in response to a read enable signal RE or a write enable signal WE is toggled.

In the read operation of the nonvolatile memory device, a determination as to whether a column address, counted and generated by an internal circuit, is a normal address or a repair address is to be performed. Thus, the column address is to be sent to a plane through a repair address comparator. For this reason, column addresses may take longer in reaching a plane due to use of the repair address comparator, and an adequate margin for performing the count operation of the column address circuit at a high-speed operation may be compromised. Consequently, an error may occur in the data output operation.

BRIEF SUMMARY

Exemplary embodiments relate to the column address circuit of a semiconductor memory device and a method of generating column addresses, which are capable of securing an adequate margin for a count operation of the column address circuit by generating an internal dummy clock using a dummy enable signal, activated prior to a read enable signal when the read operation of the semiconductor memory device is performed, and previously counting and generating the column addresses by the preset number of times.

The column address circuit of a semiconductor memory device according to an aspect of the present disclosure includes a column address generation circuit configured to generate an internal dummy clock in response to a dummy enable signal, generate an internal clock in response to a read enable signal, generate first count addresses in response to the internal dummy clock, and generate normal count addresses in response to the internal clock after the generation of the first count addresses, wherein the read enable signal is activated later than the dummy enable signal, and a column address output circuit configured to store the first count addresses and the normal addresses and to generate column addresses by synchronizing the first count addresses and the normal addresses with output clocks, respectively.

A method of generating column addresses according to another aspect of the present disclosure includes generating an internal dummy clock in response to a dummy enable signal, wherein dummy enable signal is activated earlier than a read enable signal, generating first count addresses by counting the internal dummy clock, generating initial column addresses of column addresses by synchronizing the first count addresses with one of output clocks, generating an internal clock in response to the read enable signal, generating normal count addresses after the first count addresses by counting the internal clock, and generating the remaining column addresses after the generation of the initial column addresses by synchronizing the normal count addresses with the other of the output clocks.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
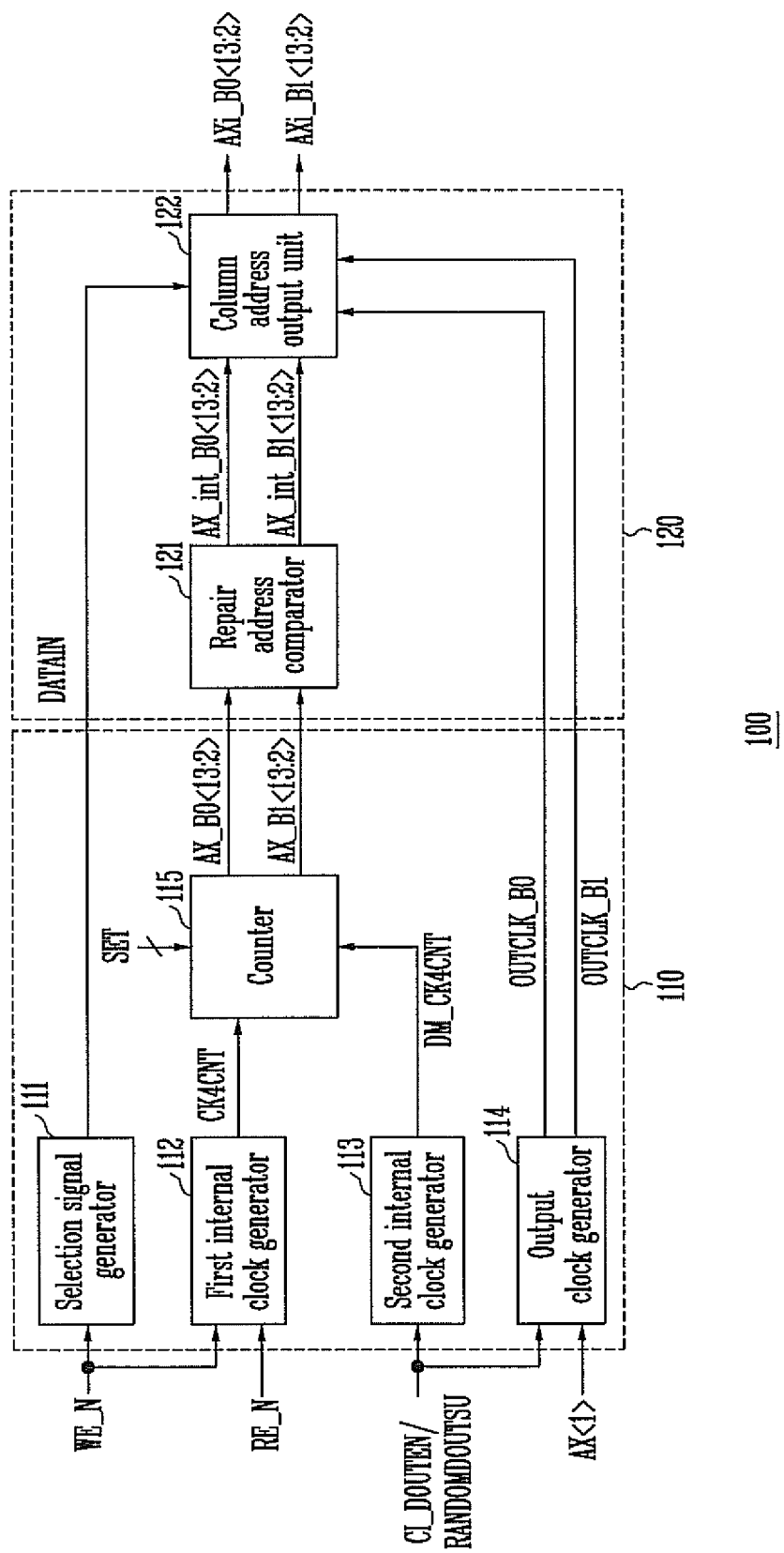
FIG. 1 shows the construction of a column address circuit according to an exemplary embodiment of this disclosure.

FIG. 1 shows the construction of a column address circuit according to an exemplary embodiment of this disclosure.

Referring to FIG. 1, the column address circuit 100 of a semiconductor memory device includes a column address generation circuit 110 and a column address output circuit 120.

The column address generation circuit 110 includes a selection signal generator 111, a first internal clock generator 112, a second internal clock generator 113, an output clock generator 114, and a counter 115.

The selection signal generator 111 generates a data input signal DATAIN in response to a write enable signal WE_N which is activated and toggled when a program operation is performed.

The first internal clock generator 112 generates an internal count clock CK4CNT in response to the write enable signal WE_N or a read enable signal RE_N which is activated and toggled when a read operation is performed.

The second internal clock generator 113 generates an internal dummy count clock DM_CK4CNT in response to a dummy enable signal. The dummy enable signal is a data output enable signal CI_DOUTEN or a random data output signal RANDOMDOUTSU. The second internal clock generator 113 generates the internal dummy count clock DM_CK4CNT in response to the data output enable signal CI_DOUTEN, which is activated when a normal read operation is performed, or the random data output signal RANDOMDOUTSU, which is activated when a random read operation is performed. In the normal read operation or the random read operation, the time when the data output enable signal CI_DOUTEN or the random data output signal RANDOMDOUTSU is activated is earlier than the time when the read enable signal RE_N is activated and toggled. In other words, the read enable signal RE_N is activated and toggled after the data output enable signal CI_DOUTEN or the random data output signal RANDOMDOUTSU is activated. Accordingly, in a read operation, after a set number of the internal dummy count clocks DM_CK4CNT is toggled, the internal count clock CK4CNT starts to toggle.

The output clock generator 114 generates a first data output clock OUTCLK_B0 and a second data output clock OUTCLK_B1 in response to the data output enable signal CI_DOUTEN or the random data output signal RANDOMDOUTSU and an externally inputted address signal AX<1>.

The counter 115 generates first count addresses AX_B0<13:2> and second count addresses AX_B1<13:2> by counting the internal count clock CK4CNT and the internal dummy count clock DM_CK4CNT generated by the first internal clock generator 112 and the second internal clock generator 113, respectively. More particularly, when a start address of the counter 115 is set by a set signal SET corresponding to externally input address signals, the counter 115 generates the first count addresses AX_B0<13:2> and the second count addresses AX_B1<13:2> by sequentially increasing an address value from the start address in response to the internal dummy count clock DM_CK4CNT and the internal count clock CK4CNT. The first count addresses AX_B0<13:2> and the second count addresses AX_B1<13:2> have an inverse relationship.

The column address output circuit 120 includes a repair address comparator 121 and a column address output unit 122.

The repair address comparator 121 determines whether a repair address is identical with the first count addresses AX_B0<13:2> and the second count addresses AX_B1<13:2> received from the counter 115 and then outputs first internal addresses AX_int_BO<13:2> and second internal addresses AX_int_BO<13:2>. The repair address comparator 121 compares the first count addresses AX_B0<13:2> and the second count addresses AX_B1<13:2> with the repair address stored in an internal CAM cell or fuse unit and, if the received addresses are identical with the stored repair address, outputs the received addresses as a repair address.

The column address output unit 122 generates first column addresses Axi_BO<13:2> and second column address signals Axi_B1<13:2> by synchronizing the first data output clock OUTCLK_B0 and the second data output clock OUTCLK_B1, received from the output clock generator 114, with the first internal addresses AX_int_BO<13:2> and the second internal addresses AX_int_B1<13:2>, respectively, or outputs the first internal addresses AX_int_BO<13:2> and the second internal addresses AX_int_B1<13:2> as the first column addresses Axi_BO<13:2> and the second column address signals Axi_B1<13:2> in response to the data input signal DATAIN of the selection signal generator 111.

Figure 2:
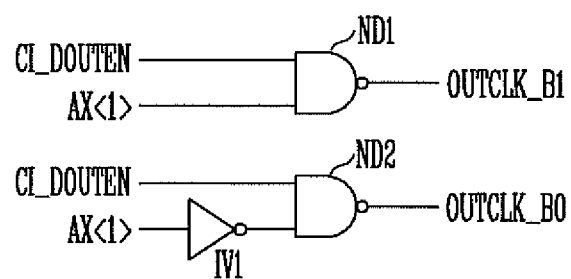
FIG. 2 is a detailed circuit diagram of a output clock generator shown in FIG. 1.

FIG. 2 is a detailed circuit diagram of the output clock generator 114 shown in FIG. 1.

Referring to FIG. 2, the output clock generator 114 includes NAND gates ND1 and ND2 and an inverter IV1. The NAND gate ND1 generates the second data output clock OUTCLK_B1 by logically combining the data output enable signal CI_DOUTEN or the random data output enable signal RANDOMDOUTSU with the address signal AX<1>. That is, the NAND gate ND1 outputs the second data output clock OUTCLK_B1 having an opposite logic level to the address signal AX<1> when the data output enable signal CI_DOUTEN or the random data output enable signal RANDOMDOUTSU is activated to a high level.

The inverter IV1 inverts the address signal AX<1> and outputs an inverted signal to the NAND gate ND2. The NAND gate ND2 generates the first data output clock OUTCLK_B0 by logically combining the data output enable signal CI_DOUTEN or the random data output enable signal RANDOMDOUTSU with the address signal AX<1> inverted by the inverter IV1. That is, the NAND gate ND2 generates the first data output clock OUTCLK_B0 having the same logic level as the address signal AX<1> when the data output enable signal CI_DOUTEN is activated to a high level.

Figure 3:
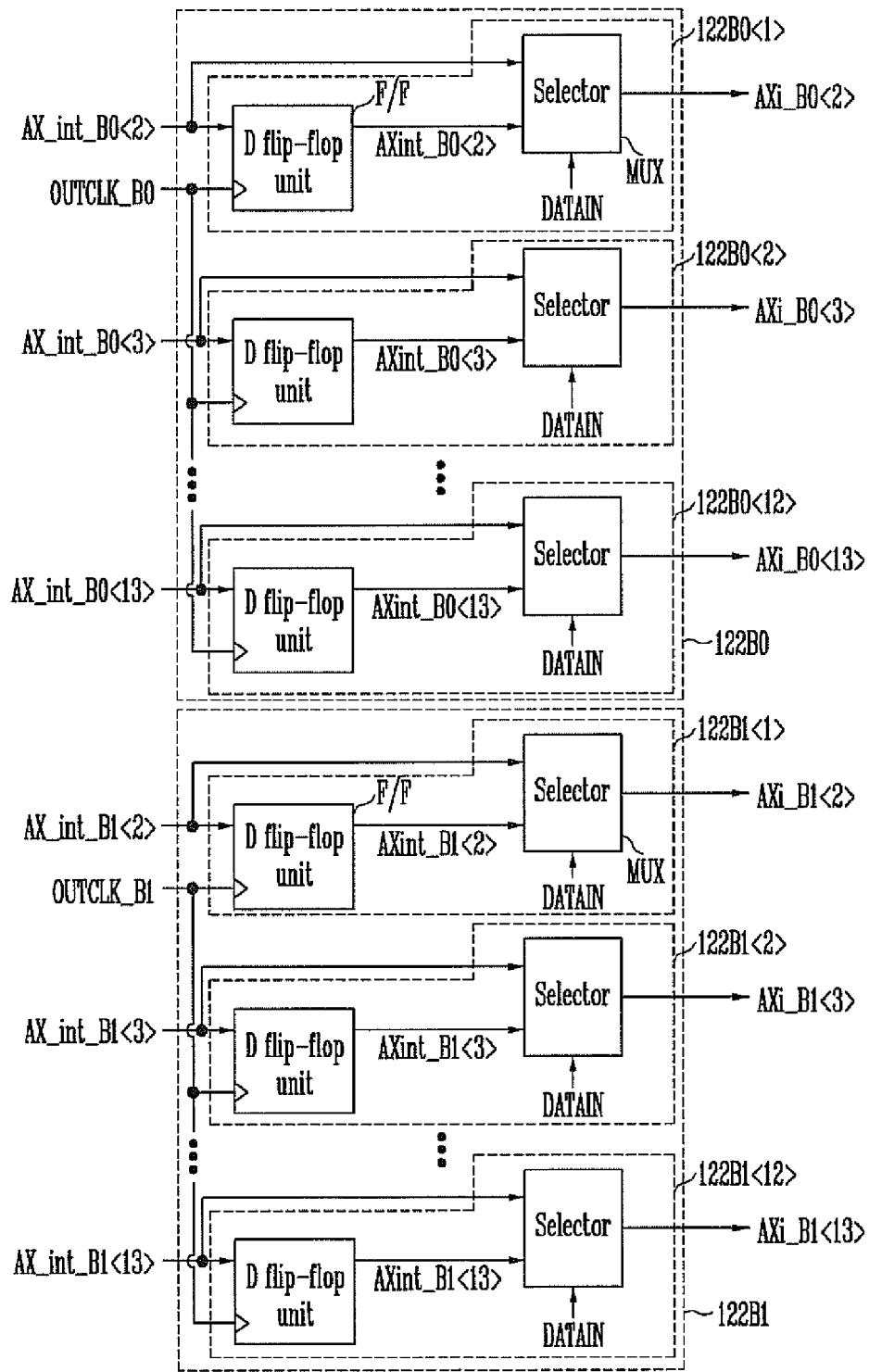
FIG. 3 is a detailed circuit diagram of a column address output unit shown in FIG. 1.

FIG. 3 is a detailed circuit diagram of the column address output unit 122 shown in FIG. 1.

Referring to FIG. 3, the column address output unit 122 includes a first address output unit 122B0 and a second address output unit 122B1. The first address output unit 122B0 generates the first column addresses Axi_BO<13:2> by synchronizing the first internal addresses AX_int_BO<13:2> with the first data output clock OUTCLK_B0 or generates the first internal addresses AX_int_BO<13:2> as the first column addresses Axi_BO<13:2> in response to the data input signal DATAIN.

The first address output unit 122B0 includes a plurality of output units 122BO<1> to 122B0<12>. The output units 122BO<1> to 122B0<12> have the same construction, and thus the construction of output unit 122B0<1> is described as an example.

The output unit 122BO<1> includes a D flip-flop unit F/F and a selector MUX. The D flip-flop unit F/F temporarily stores the first internal address AX_int_B0<2> and generates a first internal generation address AXint_BO<2> by synchronizing the first internal address AX_int_BO<2> with the first data output clock OUTCLK_B0. The selector MUX receives the first internal generation address AXint_B0<2> and the first internal address AX_int_BO<2> and outputs any one of the first internal generation address AXint_BO<2> and the first internal address AX_int_BO<2> as the first column address Axi_BO<2> in response to the data input signal DATAIN. More specifically, the selector MUX outputs the first internal generation address AXint_B0<2> as the first column address Axi_BO<2> when the data input signal DATAIN is deactivated to a low level and outputs the first internal address AXint_BO<2> as the first column address Axi_BO<2> when the data input signal DATAIN is activated to a high level.

The second address output unit 122B1 generates the second column addresses Axi_B1<13:2> by synchronizing the second internal addresses AX_int_B1<13:2> with the second data output clock OUTCLK_B1 or outputs the second internal addresses AX_int_B1<13:2> as the second column addresses Axi_B1<13:2> in response to the data input signal DATAIN.

The second address output unit 122B1 includes a plurality of output units 122B1<1> to 122B1<12>. The output unit 122B1<1> to 122B1<12> have the same construction, and thus the construction of output unit 122B1<1> is described as an example.

The output unit 122B1<1> includes a D flip-flop unit F/F and a selector MUX. The D flip-flop unit F/F temporarily stores the second internal address AX_int_B1<2> and generates a second internal generation address AXint_B1<2> by synchronizing the second internal address AX_int_B1<2> with the second data output clock OUTCLK_B1. The selector MUX receives the second internal generation address AXint_B1<2> and the second internal address AX_int_B1<2> and outputs any one of the second internal generation address AXint_B1<2> and the second internal address AX_int_B1<2> as the second column address Axi_B1<2> in response to the data input signal DATAIN. More specifically, the selector MUX outputs the second internal generation address AXint_B1<2> as the second column address Axi_B1<2> when the data input signal DATAIN is deactivated to a low level and outputs the second internal address AX_int_B1<2> as the second column address Axi_B1<2> when the data input signal DATAIN is activated to a high level.

Figure 4:
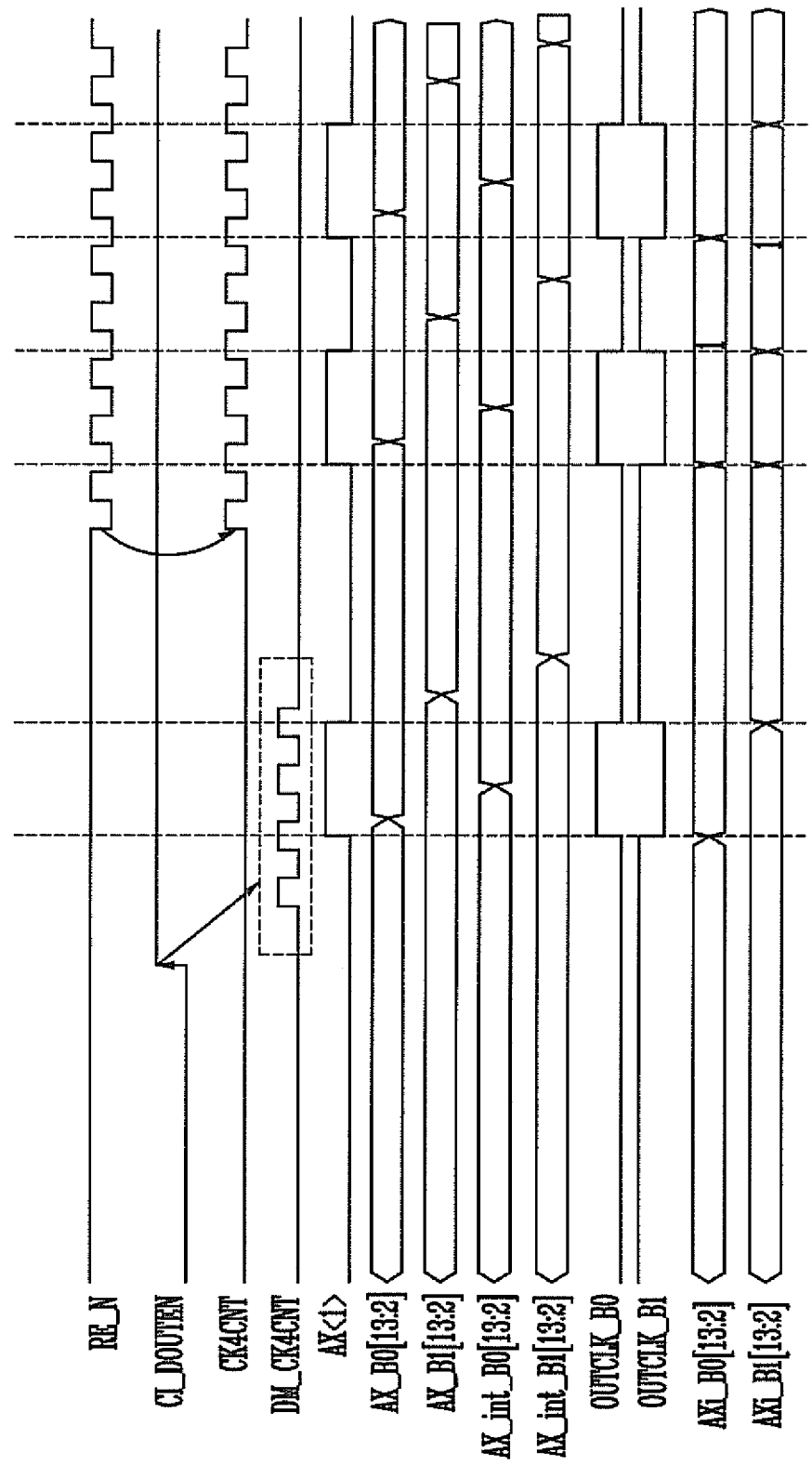
FIG. 4 is a signal waveform illustrating a normal read operation of the column address circuit according to an exemplary embodiment of this disclosure.

FIG. 4 is a signal waveform illustrating a normal read operation of the column address circuit according to an exemplary embodiment of this disclosure.

When a normal read operation is started, the second internal clock generator 113 generates the internal dummy count clock DM_CK4CNT in response to the data output enable signal CI_DOUTEN activated earlier than the read enable signal RE_N.

The output clock generator 114 generates the first data output clock OUTCLK_B0 and the second data output clock OUTCLK_B1 in response to the data output enable signal CI_DOUTEN and the address signal AX<1>.

The counter 115 generates the first count addresses AX_B0<13:2> and the second count addresses AX_B1<13:2> by counting the internal dummy count clock DM_CK4CNT generated by the second internal clock generator 113. More particularly, when a start address of the counter 115 is set in response to a set signal SET corresponding to externally inputted address signals, the counter 115 counts the internal dummy count clock DM_CK4CNT and generates the first count addresses AX_B0<13:2> and the second count addresses AX_B1<13:2> by sequentially increasing the start address. The first count addresses AX_B0<13:2> and the second count addresses AX_B1<13:2> have an inverse relationship.

Accordingly, the counter 115 generates the first count addresses AX_B0<13:2> and the second count addresses AX_B1<13:2> by counting the internal dummy count clock DM_CK4CNT which is generated in response to the data output enable signal CI_DOUTEN activated before the read enable signal RE_N is activated. That is, the count operation may be performed before the read enable signal RE_N is activated. Thereafter, when the read enable signal RE_N is activated and toggled, the counter 115 counts the internal count clock CK4CNT generated by the first internal clock generator 112 and generates the remaining first count addresses AX_B0<13:2> and the remaining second count addresses AX_B1<13:2> by increasing an address value from the last count address generated by the internal dummy count clock DM_CK4CNT.

The repair address comparator 121 receives the first count addresses AX_B0<13:2> and the second count addresses AX_B1<13:2>, determines whether the received count addresses are identical with a repair address, and generates the first internal addresses AX_int_BO<13:2> and the second internal addresses AX_int_B1<13:2>.

The column address output unit 122 generates the first column addresses Axi_BO<13:2> and the second column address signals Axi_B1<13:2> by synchronizing the first internal addresses AX_int_BO<13:2> and the second internal addresses AX_int_B1<13:2> with the first data output clock OUTCLK_B0 and the second data output clock OUTCLK_B1 received from the output clock generator 114, respectively. In the read operation, when the write enable signal WE_N is deactivated, the selection signal generator 111 generates the data input signal DATAIN of a low level. In response thereto, the column address output unit 122 generates the first and second column addresses AXi_B0<13:2> and AXi_B1<13:2> by synchronizing the first internal addresses AX_int_BO<13:2> and the second internal addresses AX_int_B1<13:2> with the first data output clock OUTCLK_B0 and the second data output clock OUTCLK_B1 received from the output clock generator 114, respectively, and then outputs the first and second internal generation addresses AXint_B0<13:2> and AXint_B1<13:2> as the first column addresses Axi_BO<13:2> and the second column address signals Axi_B1<13:2>.

Figure 5:
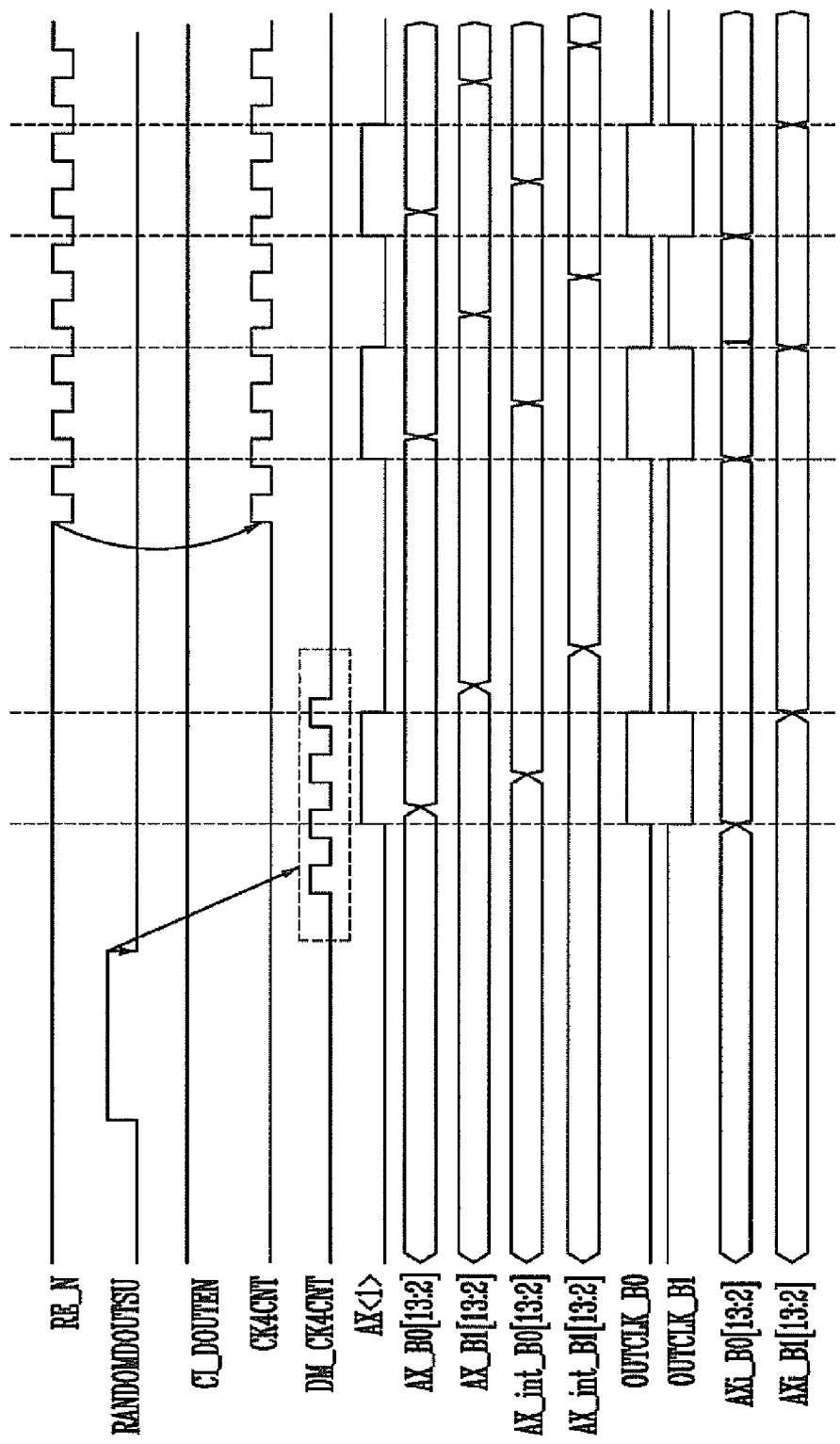
FIG. 5 is a signal waveform illustrating a random read operation of the column address circuit according to an exemplary embodiment of this disclosure.

FIG. 5 is a signal waveform illustrating a random read operation of the column address circuit according to an exemplary embodiment of this disclosure.

When a random read operation is started, the second internal clock generator 113 generates the internal count clock DM_CK4CNT in response to the random data output signal RANDOMDOUTSU activated earlier than the read enable signal RE_N.

The output clock generator 114 generates the first data output clock OUTCLK_B0 and the second data output clock OUTCLK_B1 in response to the data output enable signal CI_DOUTEN and any one (AX<1>) of the externally inputted address signals.

The counter 115 generates the first count addresses AX_B0<13:2> and the second count addresses AX_B1<13:2> by counting the internal dummy count clock DM_CK4CNT generated by the second internal clock generator 113. More particularly, when a start address of the counter 115 is set in response to the set signal SET corresponding to the address signals, the counter 115 counts the internal dummy count clock DM_CK4CNT and generates the first count addresses AX_B0<13:2> and the second count addresses AX_B1<13:2> by sequentially increasing an initial address value. The first count addresses AX_B0<13:2> and the second count addresses AX_B1<13:2> have an inverse relationship.

Accordingly the counter 115 generates the first count addresses AX_B0<13:2> and the second count addresses AX_B1<13:2> by counting the internal count clock CK4CNT which is generated in response to the random data output signal RANDOMDOUTSU activated before the read enable signal RE_N is activated. More specifically, before the read enable signal RE_N is activated, the count operation may be performed. Thereafter, when the read enable signal RE_N is activated and toggled, the counter 115 counts the internal count clock CK4CNT generated by the first internal clock generator 112 and generates the remaining first count addresses AX_B0<13:2> and the remaining second count addresses AX_B1<13:2> by increasing an address value from the last count address generated by the internal dummy count clock DM_CK4CNT.

The repair address comparator 121 receives the first count addresses AX_B0<13:2> and the second count addresses AX_B1<13:2>, determines whether a repair address is identical with the first count addresses AX_B0<13:2> and the second count addresses AX_B1<13:2>, and generates the first internal addresses AX_int_BO<13:2> and the second internal addresses AX_int_B1<13:2>.

The column address output unit 122 generates the first column addresses Axi_BO<13:2> and the second column address signals Axi_B1<13:2> by synchronizing the first internal addresses AX_int_B0<13:2> and the second internal addresses AX_int_B1<13:2> with the first data output clock OUTCLK_B0 and the second data output clock OUTCLK_B1 received from the output clock generator 114, respectively. In the read operation, when the write enable signal WE_N is deactivated, the selection signal generator 111 outputs the data input signal DATAIN of a low level. In response thereto, the column address output unit 122 generates the first and second column addresses AXi_B0<13:2> and AXi_B1<13:2> by synchronizing the first internal addresses AX_int_B0<13:2> and the second internal addresses AX_int_B1<13:2> with the first data output clock OUTCLK_B0 and the second data output clock OUTCLK_B1 received from the output clock generator 114, respectively, and then outputs the first and second internal generation addresses AXint_B0<13:2> and AXint_B1<13:2> as the first column addresses Axi_B0<13:2> and the second column address signals Axi_B1<13:2>.

According to the exemplary embodiments of this disclosure, the internal dummy count clock DM_CK4CNT is generated in response to the data output enable signal CI_DATAOUTEN or the random data output signal RANDOMDOUTSU which is activated before the read enable signal RE_N is activated. Some of the first count addresses AX_B0<13:2> and the second count addresses AX_B1<13:2> are generated before the read enable signal RE_N is activated by counting the internal dummy count clock DM_CK4CNT. Accordingly, an adequate margin for column addresses due despite the loading time taken in using a repair address comparator can be obtained.

Furthermore, in a read operation of the semiconductor memory device, an internal clock is activated in response to the data output enable signal activated at a timing point earlier than the activation of the read enable signal, the column addresses are previously counted for a the preset number of times, and the previously counted column addresses are outputted when the column addresses are outputted. Accordingly, the column address circuit of the semiconductor memory device capable of securing the margin of a count operation of the column address circuit can be provided.

What is claimed is:

1. A column address circuit of a semiconductor memory device, comprising:
    a column address generation circuit configured to generate an internal dummy clock in response to a dummy enable signal, generate an internal clock in response to a read enable signal, generate first count addresses in response to the internal dummy clock, and generate normal count addresses in response to the internal clock after the generation of the first count addresses, wherein the read enable signal is activated later than the dummy enable signal; and
    a column address output circuit configured to store the first count addresses and the normal addresses and to generate column addresses by synchronizing the first count addresses and the normal addresses with output clocks, respectively.

2. The column address circuit of claim 1, further comprising an output clock generator for generating the output clocks in response to the dummy enable signal and an address signal.

3. The column address circuit of claim 1, wherein the column address generation circuit comprises:
    a first internal clock generator for generating the internal clock in response to the read enable signal;
    a second internal clock generator for generating the internal dummy clock in response to the dummy enable signal; and
    a counter for generating the first count addresses by counting the internal dummy clock and for generating the normal count addresses by counting the internal clock.

4. The column address circuit of claim 1, wherein the column address output circuit comprises:
    a repair address comparator for generating internal addresses by comparing the first count addresses and the normal count addresses with a repair address; and
    a column address output unit for generating the column addresses by synchronizing the internal addresses with the output clocks.

5. The column address circuit of claim 2, wherein the output clock generator comprises:
    a first logic gate for generating the output clocks by logically combining the dummy enable signal and the address signal; and
    a second logic gate for generating inverse output clocks having inverse logic levels to the output clocks by logically combining the dummy enable signal and an inverse signal of the address signal.

6. The column address circuit of claim 4, further comprising a selection signal generator for generating a data input signal in response to a write enable signal, wherein the write enable signal is activated when a program operation is started.

7. The column address circuit of claim 6, wherein the column address output unit comprises a plurality of output units for generating respective ones of the column addresses by each synchronizing a respective one of the output clocks with a respective one of the internal addresses.

8. The column address circuit of claim 7, wherein each of the plurality of output units comprises:
    a flip-flop unit for generating an internal generation address by synchronizing the respective one of the internal addresses with the selected one of the output clocks; and
    a selector for outputting either the internal generation address or the respective one of the internal addresses as a respective one of the column addresses in response to the data input signal.

9. The column address circuit of claim 1, wherein the dummy enable signal is a data output enable signal, which is activated when a normal read operation is performed, or a random data output signal, which is activated when a random read operation is performed.

10. A column address circuit of a semiconductor memory device, comprising:
    a column address generation unit configured to generate some of a plurality of count addresses by counting an internal dummy clock generated in response to a dummy enable signal when a read operation is started and generate remaining count addresses of the plurality of count addresses by counting an internal clock generated in response to a read enable signal, wherein the dummy enable signal is activated earlier than a read enable signal;
    an output clock generator configured to generate output clocks in response to the dummy enable signal and an address signal;
    a repair address comparator configured to generate internal addresses by comparing the count addresses and a repair address; and
    a column address output unit configured to output the internal addresses as the column addresses by synchronizing the internal addresses with the output clocks in order to compensate for a delay time due to the repair address comparator.

11. The column address circuit of claim 10, wherein the column address generation unit comprises:
    a first internal clock generator for generating the internal clock in response to the read enable signal;

a second internal clock generator for generating the internal dummy clock in response to the dummy enable signal; and a counter for generating the count addresses by counting the first internal clock and the second internal clock.

12. The column address circuit of claim 10, wherein the output clock generator comprises:

a first logic gate for generating the output clocks by logically combining the dummy enable signal and the address signal; and a second logic gate for generating an opposite output clocks having an opposite logic level to the output clocks by logically combining the dummy enable signal and an inverse signal of the address signal.

13. The column address circuit of claim 10, wherein the column address generation unit further comprises a selection signal generator for generating a data input signal in response to a write enable signal when a program operation is started.

14. The column address circuit of claim 13, wherein the column address output unit comprises a plurality of output units each configured to generate one of the column addresses by synchronizing one of the output clocks with one of the internal addresses.

15. The column address circuit of claim 14, wherein each of the plurality of output units comprises:

a flip-flop unit for generating an internal generation address by synchronizing one of the internal addresses with one of the output clocks; and a selector for outputting either the internal generation address or one of the internal addresses as one of the column addresses in response to the data input signal.

16. The column address circuit of claim 10, wherein the dummy enable signal is a data output enable signal, which is activated when a normal read operation is performed, or a random data output signal, which is activated when a random read operation is performed.

17. A column address circuit of a semiconductor memory device, comprising:

a column address generation circuit configured to generate some of count addresses by counting an internal dummy clock and then generate remaining count addresses of the count addresses by counting the internal clock, wherein the internal dummy clock is generated earlier than an internal clock;

a output clock generator configured to generate output clocks; and a column address output circuit configured to generate column addresses by synchronizing the counted addresses with the output clocks.

18. The column address circuit of claim 17, wherein the column address generation circuit comprises:

a first internal clock generator for generating the internal clock in response to a read enable signal;

a second internal clock generator for generating the internal dummy clock in response to a dummy enable signal; and a counter for generating the count addresses by counting the internal dummy clock and the internal clock.

19. The column address circuit of claim 17, wherein the column address output circuit comprises:

a repair address comparator for generating internal addresses by comparing the count addresses and a repair address; and a column address output unit for outputting the column addresses by synchronizing the internal addresses with the output clocks.

20. The column address circuit of claim 17, wherein the output clock generator comprises:

a first logic gate for generating the output clocks by logically combining a dummy enable signal and an address signal; and a second logic gate for generating inverse output clocks having inverse logic levels to the output clocks by logically combining the dummy enable signal and an inverse signal of the address signal.

21. The column address circuit of claim 20, further comprising a selection signal generator for generating a data input signal in response to a write enable signal, wherein the write enable signal is activated when a program operation is started.

22. The column address circuit of claim 21, wherein the column address output unit comprises a plurality of output units each configured to generate one of the column addresses by synchronizing one of the output clocks with one of the internal addresses.

23. The column address circuit of claim 22, wherein each of the plurality of output units comprises:

a flip-flop unit for generating an internal generation address by synchronizing one of the internal addresses with one of the output clocks; and a selector for outputting either the internal generation address or one of the internal addresses as one of the column addresses in response to the data input signal.

24. A column address circuit of a semiconductor memory device, comprising:

a first internal clock generator configured to generate an internal dummy clock in response to a dummy enable signal;

a second internal clock generator configured to generate an internal clock in response to a read enable signal, wherein the read enable signal is activated later than the dummy enable signal;

a counter configured to generate first count addresses in response to the internal dummy clock and generate normal count addresses in response to the internal clock after the generation of the first count addresses; and a column address output circuit configured to sequentially store the first count addresses and the normal addresses and sequentially output the first count addresses and the normal addresses as column addresses in response to output clocks.

25. The column address circuit of claim 24, further comprising an output clocks generation circuit for generating the output clocks in response to the dummy enable signal and an address signal.

26. A method of generating column addresses, comprising:

generating an internal dummy clock in response to a dummy enable signal, wherein the dummy enable signal is activated earlier than a read enable signal;

generating first count addresses by counting the internal dummy clock;

generating initial column addresses of column addresses by synchronizing the first count addresses with output clocks;

generating an internal clock in response to the read enable signal;

generating normal count addresses after the first count addresses by counting the internal clock; and generating remaining column addresses after the generation of the initial column addresses by synchronizing the normal count addresses with the output clocks.

27. The method of claim 26, wherein the internal clock is generated after the internal dummy clock is generated.

28. The method of claim 26, wherein the output clocks are generated in response to the dummy enable signal and an address signal.

29. A method of generating column addresses, comprising:
generating an internal dummy clock in response to a dummy enable signal, wherein the dummy enable signal is activated earlier than a read enable signal;
generating first count addresses by counting the internal dummy clock;
generating an internal clock in response to the read enable signal;
generating normal count addresses after the first count addresses by counting the internal clock; and
generating column addresses by synchronizing the first count addresses or normal count addresses with output clocks.

30. The method of claim 29, wherein the output clocks are generated in response to the dummy enable signal and an address signal.

31. A method of generating column addresses, comprising:
setting a start address according to a counter setting signal;
generating count addresses by sequentially increasing the start address in response to a dummy enable signal;
outputting an internal address according to the count addresses; and
outputting the internal address to a column address by synchronizing the internal address with a data output clock.

* * * * *